(12) United States Patent
Yamada et al.

(10) Patent No.: US 11,335,849 B2
(45) Date of Patent: May 17, 2022

(54) MAGNETIC DOMAIN WALL DISPLACEMENT TYPE MAGNETIC RECORDING ELEMENT AND MAGNETIC RECORDING ARRAY

(71) Applicant: TDK CORPORATION, Tokyo (JP)

(72) Inventors: Shogo Yamada, Tokyo (JP); Tomoyuki Sasaki, Tokyo (JP); Yukio Terasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 577 days.

(21) Appl. No.: 16/191,893

(22) Filed: Nov. 15, 2018

(65) Prior Publication Data

US 2020/0044141 A1 Feb. 6, 2020

(30) Foreign Application Priority Data

Aug. 2, 2018 (JP) .............................. JP2018-145584

(51) Int. Cl.
  *H01L 27/22* (2006.01)
  *H01L 43/02* (2006.01)
  *H01L 43/10* (2006.01)

(52) U.S. Cl.
  CPC ............ *H01L 43/02* (2013.01); *H01L 27/222* (2013.01); *H01L 43/10* (2013.01)

(58) Field of Classification Search
  CPC ............. H01L 43/02–10; H01L 27/222; H01L 27/11587; G06F 7/5443; Y10T 428/11
  See application file for complete search history.

(56) References Cited

U.S. PATENT DOCUMENTS

2009/0296454 A1* 12/2009 Honda ................ G11C 11/1659
  365/158
2010/0097847 A1* 4/2010 Ohmori ............... G11C 11/1673
  365/158

(Continued)

FOREIGN PATENT DOCUMENTS

JP 2010-098245 A 4/2010
JP 2011-119537 A 6/2011

(Continued)

OTHER PUBLICATIONS

Dec. 13, 2019 Search Report issued in European Patent Application No. 19179711.7.

*Primary Examiner* — Eric K Ashbahian
(74) *Attorney, Agent, or Firm* — Oliff PLC

(57) ABSTRACT

A magnetic domain wall displacement type magnetic recording element which comprises: a first magnetization fixed part which is stacked in a first direction, a magnetic recording layer which includes a magnetic domain wall and extends in a second direction which crosses with the first direction, a non-magnetic layer which is provided between the first magnetization fixed part and the magnetic recording layer, and a first via part which is electrically connected to the magnetic recording layer, wherein at least a part of the first via part is located at a position which is apart from the first magnetization fixed part in the second direction in planar view observed from the first direction, the magnetic recording layer includes a first part which has a position where the first magnetization fixed part overlaps with the magnetic recording layer in planar view observed from the first direction, and a width of the first via part in a third direction which is orthogonal to the second direction is larger than a width of said position of the first part of the magnetic recording layer.

15 Claims, 7 Drawing Sheets

(56) References Cited

U.S. PATENT DOCUMENTS

| | | | |
|---|---|---|---|
| 2010/0149862 A1 | 6/2010 | Ishiwata et al. | |
| 2010/0193889 A1* | 8/2010 | Nagahara | G11C 11/161 257/421 |
| 2010/0315854 A1* | 12/2010 | Suzuki | G11C 11/161 365/87 |
| 2019/0206431 A1* | 7/2019 | Sasaki | H01L 43/02 |

FOREIGN PATENT DOCUMENTS

| | | | | |
|---|---|---|---|---|
| JP | 5099368 B2 | 12/2012 | | |
| JP | 5360596 B2 | 12/2013 | | |
| WO | 2008/108109 A1 | 9/2008 | | |
| WO | 2009/057504 A1 | 5/2009 | | |
| WO | WO2009057504 | * | 7/2009 | H01L 43/08 |

\* cited by examiner

MAGNETIC DOMAIN WALL DISPLACEMENT TYPE MAGNETIC RECORDING ELEMENT AND MAGNETIC RECORDING ARRAY

TECHNICAL FIELD

The present disclosure relates to a magnetic domain wall displacement type magnetic recording element and a magnetic recording array.

Priority is claimed on Japanese Patent Application No. 2018-145584, filed Aug. 2, 2018, the content of which is incorporated herein by reference.

BACKGROUND OF THE INVENTION

Description of Related Art

A next-generation nonvolatile memory has attracted attention as a memory substituting for a flash memory or the like which has come to have a limit in miniaturization. For example, MRAM (Magnetoresistive Random Access Memory), ReRAM (Resistance Random Access Memory), PCRAM (Phase Change Random Access Memory) and the like are known as a next generation non-volatile memory.

MRAM uses a resistance change caused by the magnetization direction for recording data. In order to increase the capacity of the recording memory, studies of reducing the size of the elements constituting the recording memory and of multileveling the recoding bits per element constituting the memory have been performed.

A magnetic domain wall displacement type magnetic recording element is described in Patent Document 1. The resistance value of the magnetic domain wall displacement type magnetic recording element changes according to the position of the magnetic domain wall. The magnetic domain wall displacement type magnetic recording element can function as a multilevel memory by reading out the change of the resistance value.

A magnetic domain wall displacement type magnetic recording element records the data by controlling the magnetic domain wall. Stable control of the magnetic domain wall can increase reliability of data recording. However, it is difficult to stably and continuously operate a magnetic domain wall of conventional magnetic domain wall displacement type magnetic recording elements, since heat is generated in a magnetic recording layer by an electric current which flows at the time of recording. As a result, there was a possibility that data recording reliability as a multilevel memory is deteriorated.

Prior Art Documents

PATENT DOCUMENTS

Patent Document 1: Japanese Patent No. 5360596

SUMMARY OF THE INVENTION

The present disclosure is provided in view of the aforementioned problems, and the purpose of the present disclosure is to provide a magnetic domain wall displacement type magnetic recording element, which is excellent in controllability of a magnetic domain wall, and a magnetic recording array.

The present disclosure provides a magnetic domain wall displacement type magnetic recording element which includes; a first magnetization fixed part which is stacked in a first direction, a magnetic recording layer which includes a magnetic domain wall and extends in a second direction which crosses with the first direction, a non-magnetic layer which is provided between the first magnetization fixed part and the magnetic recording layer, and a first via part which is electrically connected to the magnetic recording layer, wherein the first via part is positioned in the second direction from the first magnetization fixed part, and a width of the first via part in a third direction which is orthogonal to the second direction is larger than a width of a first part of the magnetic recording layer where the first magnetization fixed part overlaps with the magnetic recording layer. That is, a recording element shown below is provided.

(1) A first aspect of the present disclosure provides
a magnetic domain wall displacement type magnetic recording element which includes;
a first magnetization fixed part which is stacked in a first direction,
a magnetic recording layer which includes a magnetic domain wall and extends in a second direction which crosses with the first direction,
a non-magnetic layer which is provided between the first magnetization fixed part and the magnetic recording layer, and
a first via part which is electrically connected to the magnetic recording layer,
wherein
at least a part of the first via part is located at a position which is apart from the first magnetization fixed part in the second direction in planar view observed from the first direction,
the magnetic recording layer includes a first part which has a position where the first magnetization fixed part overlaps with the magnetic recording layer in planar view observed from the first direction, and
a width of the first via part in a third direction which is orthogonal to the second direction is larger than a width of said position of the first part of the magnetic recording layer.

(2) With respect to the magnetic domain wall displacement type magnetic recording element of the aforementioned aspect,
the magnetic recording layer may include the first part and a second part which connects with the first part, and
the second part is located on the side closer to the first via part than the first part, and contacts or does not contact with the first via part, and
the cross section of the second part may be larger than the cross section of the first part, wherein the cross-sectional areas are those obtained by cutting the magnetic recording layer at faces which are perpendicular to the second direction.

(3) With respect to the magnetic domain wall displacement type magnetic recording element of the aforementioned aspect, a first end of the second part, which is located at a side closer to the first magnetization fixed part, may be positioned between the first magnetization fixed part and the first via part in planar view observed from the first direction.

(4) With respect to the magnetic domain wall displacement type magnetic recording element of the aforementioned aspect, the width of the second part may be larger than the width of the first part in a third direction.

(5) With respect to the magnetic domain wall displacement type magnetic recording element of the aforementioned aspect, the thickness of the second part may be larger than the thickness of the first part.

(6) With respect to the magnetic domain wall displacement type magnetic recording element of the aforementioned aspect, the cross-sectional area of the second part may gradually increase toward the first via part.

(7) With respect to the magnetic domain wall displacement type magnetic recording element of the aforementioned aspect, the cross-sectional area of the first via part which is obtained by cutting the first via part at faces which are perpendicular to the first direction may be gradually changed.

(8) With respect to the magnetic domain wall displacement type magnetic recording element of the aforementioned aspect, when the element is observed from the first direction in planar view, the first via part may include a first end, which is a straight line, positioned at a side closer to the first magnetization fixed part, and mainly extends in the third direction.

(9) With respect to the magnetic domain wall displacement type magnetic recording element of the aforementioned aspect, the element may include a second via part, and when the element is observed from the first direction in planar view, the first magnetization fixed part may be located at a position between the first via part and the second via part, the second via part may be electrically connected to the magnetic recording layer, and the width of the second via part may be larger than that of the magnetic recording layer in a third direction.

(10) With respect to the magnetic domain wall displacement type magnetic recording element of the aforementioned aspect, the element may include a second magnetization fixed part between the second via part and the magnetic recording layer.

(11) With respect to the magnetic domain wall displacement type magnetic recording element of the aforementioned aspect, the length between the first via part and the second via part in the second direction may be smaller than the width in the second direction of the first magnetization fixed part.

(12) With respect to the magnetic domain wall displacement type magnetic recording element of the aforementioned aspect, at least one of the first magnetization fixed part and the second magnetization fixed part may include a magnetization fixed layer, a spacer layer and a coupling layer in this order from the side near to the magnetic recording layer, and antiferromagnetic coupling may be formed between the magnetization fixed layer and the coupling layer.

(13) The second aspect of the present disclosure is a magnetic recording array which includes a plurality of the magnetic domain wall displacement type magnetic recording elements, which is according to the aforementioned aspect.

(14) With respect to the magnetic domain wall displacement type magnetic recording element of the aforementioned aspect, the whole of the first via part may be located at the position separated from the first magnetization fixed part in the second direction in planar view observed from the first direction.

(15) With respect to the magnetic domain wall displacement type magnetic recording element of the aforementioned aspect, a part of the first via part may overlap the first magnetization fixed part in planar view observed from the first direction.

(16) With respect to the magnetic domain wall displacement type magnetic recording element of the aforementioned aspect, the first direction and the second direction may be orthogonal to each other.

(17) With respect to the magnetic domain wall displacement type magnetic recording element of the aforementioned aspect, the first via part may be a circular column, and the width of the first via part may be the diameter of a circular surface of the column.

(18) With respect to the magnetic domain wall displacement type magnetic recording element of the aforementioned aspect, the width of the magnetic recording layer may be constant in planar view observed from the first direction.

(19) With respect to the magnetic domain wall displacement type magnetic recording element of the aforementioned aspect, the width of the first part of the magnetic recording layer may be constant, and the width of at least a part of the second part may be larger than the width of the first part in planar view observed from the first direction.

(20) With respect to the magnetic domain wall displacement type magnetic recording element of the aforementioned aspect, the second part may directly contact with the first via part.

Effects of the Invention

It is possible to improve controllability of a magnetic domain wall, when the magnetic domain wall displacement type magnetic recording element according to the aforementioned aspect is used.

DETAILED DESCRIPTION OF THE INVENTION

Figure 1:
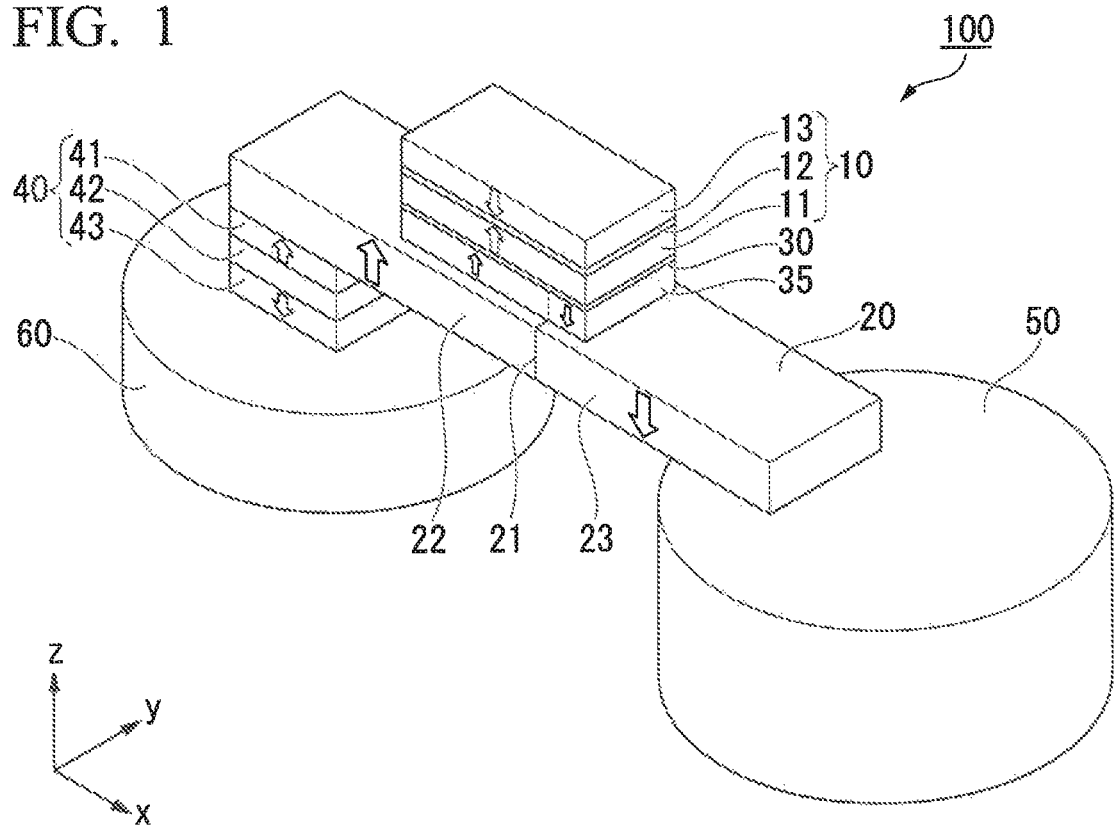
FIG. 1 is a schematic perspective view which shows a preferable example of a magnetic domain wall displacement type magnetic recording element according to the first embodiment of the present disclosure.

Hereinafter, embodiments of the present disclosure will be described with reference to the drawings in detail. In the drawings used in the following description, in order to make the features easy to understand, there is a case where characteristic portions are shown in an enlarged manner for convenience, and the dimensional ratios or the like of each constituent element may be or not be the same as the actual value. In addition, materials, dimensions and the like in the following description are mere exemplary examples, and the present disclosure is not limited thereto. Various modifications may be appropriately made in a range where the effect of the present disclosure can be achieved. For example, unless particularly limited, conditions or the like such as materials, amounts, types, number, sizes, temperature and the like, may be varied, added, and/or omitted according to necessity. Examples and characteristics of the embodiments can be combined (Magnetic Domain Wall Displacement Type Magnetic Recording Element)

First Embodiment

FIG. 1 is a perspective view which schematically shows a magnetic domain wall displacement type magnetic recording element 100 according to the first embodiment. The magnetic domain wall displacement type magnetic recording element 100 shown in FIG. 1 includes a first magnetization fixed part 10, a magnetic recording layer 20, a nonmagnetic layer 30, a magnetization transfer layer 35, a second magnetization fixed part 40, a first via part 50 and a second via part 60. In the figure explained below, the first magnetization fixed part 10, the magnetic recording layer 20, the nonmagnetic layer, the magnetization transfer layer, and the second magnetization fixed part are shown as a quadrangle in planar view. However, shapes thereof are not limited to the quadrangle, and for example, may have a shape such as circle or ellipse. Furthermore, the shapes of the first via part 50 and the second via part 60 are not limited to circle in planar view. Although the first via part 50 and the second via part 60 are shown as a columnar (cylindrical) form, the shapes thereof are not limited thereto. For example, the shapes thereof may be square, trapezoidal, polygon, ellipse, or circle from which a part thereof is removed, in planar view. The shapes thereof are preferably symmetrical in planar view.

Hereinafter, a first direction which is a stacking direction of a first magnetization fixed part 10 is described as a z direction, a second direction to which a magnetic recording layer 20 extends is described as a x direction, and a third direction which is orthogonal to the x direction and the y direction is described as a y direction. The first direction may be orthogonal to the second direction.

(First Magnetization Fixed Part)

Figure 10:
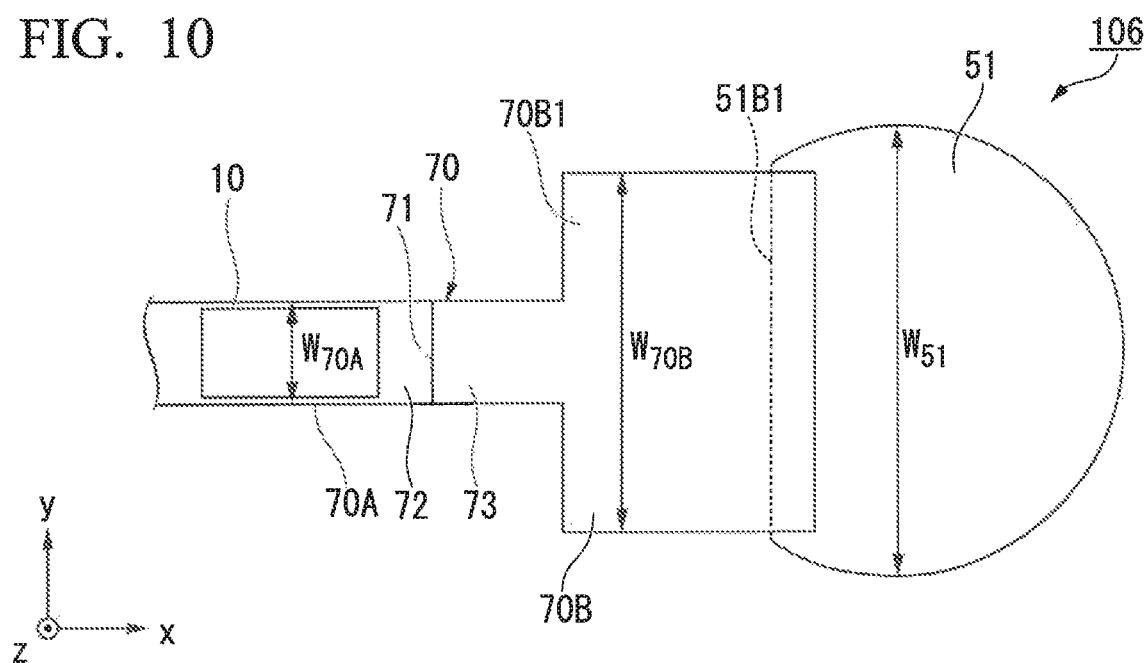
FIG. 10 is a schematic plan view which shows preferable example of a magnetic domain wall displacement type magnetic recording element according to the fourth embodiment of the present disclosure.

A first magnetization fixed part 10 shown in FIG. 10 is a laminate which includes a first magnetization fixed layer 11, a spacer layer 12 and a first coupling layer 13. The first magnetization fixed layer 11 is located at the side of the magnetic recording layer 20. The first coupling layer 13 is located apart from the magnetic recording layer 20. The spacer layer 12 is located between the first magnetization fixed layer 11 and the first coupling layer 13. Antiferromagnetic coupling is formed between the magnetization fixed layer 11 and the first coupling layer 13.

The first magnetization fixed layer 11 includes ferromagnetic material. As ferromagnetic material which can be included in the first magnetization fixed layer 11, for example, metals selected from a group consisting of Cr, Mn, Co, Fe and Ni, alloys which includes at least one of these metals, and alloys which include these metals and at least one element selected from said metals and B, C and N and the like can be used. Specifically, Co—Fe, Co—Fe—B, and Ni—Fe can be mentioned.

Heusler alloy may be used as a material which forms the first magnetization fixed layer 11. The Heusler alloy is half metal and has high spin polarizability. The Heusler alloy is an intermetallic compound which has a chemical composition of XYZ or $X_2YZ$, wherein X represents a noble metal element or a Co-, Fe-, Ni-, or Cu-group transition metal element on the periodic table, Y represents a Mn-, V-, Cr-, or Ti-group transition metal and can also represent the element represented by X, and Z represents a typical element of group III to group V. As the Heusler alloy, $Co_2FeSi$, $Co_2FeGe$, $Co_2FeGa$, $Co_2MnSi$, $Co_2Mn_{1-a}Fe_a Al_b Si_{1-b}$, $Co_2FeG_{e1-c}Ga_c$, and the like can be mentioned.

When the axis of easy magnetization of the first magnetization fixed layer 11 is provided as a z direction, that is, the perpendicular magnetization film is formed, the thickness of the first magnetization fixed layer 11 is preferably 1.5 nm or less, and more preferably 1.0 nm or less. When the thickness of the first magnetization fixed layer 11 is thin, perpendicular magnetic anisotropy (interface perpendicular magnetic anisotropy) can be added to the first magnetization fixed layer 11 at the interface between the first magnetization fixed layer 11 and the another layer (nonmagnetic layer 30). That is, the magnetization direction of the first magnetization fixed layer 11 can be set to the z direction.

The first coupling layer 13 includes a ferromagnetic material. The first coupling layer 13 forms a synthetic ferromagnetic coupling structure (SAF structure) with the first magnetization fixed layer 11. The first coupling layer 13 increases the coercivity of the first magnetization fixed layer 11. The first coupling layer 13 decreases the effect of leakage magnetic field from the first magnetization fixed layer 11. It is possible to use, for example, antiferromagnetic material such as IrMn, PtMn and the like, in the first coupling layer 13.

A spacer layer 12 is a non-magnetic layer. The magnetization of the first coupling layer 13 and the magnetization of the first magnetization fixed layer 11 forms antiferromagnetic coupling, due to the spacer layer 12 which is sandwiched between the layers.

The spacer layer 12 preferably includes at least one selected from a group consisting of Ru, Ir and Rh. The elements include many spins, and therefore spin-orbit interaction is large. Accordingly, the spacer layer 12 including the element can strongly act on the magnetization of the two ferromagnetic layers (first magnetization fixed layer 11 and first coupling layer 13) which are adjacent to the spacer layer 12, and strong antiferromagnetic coupling can be formed. The thickness of the spacer layer 12 is preferably 3 Å or more and 10 Å or less, although it may depend on the material thereof.

(Magnetic Recording Layer)

A magnetic recording layer 20 extends in the x direction. The magnetic recording layer 20 includes a magnetic domain wall 21 in the interior thereof. The magnetic domain wall 21 is a boundary between a first magnetic domain 22 and a second magnetic domain 23, and the directions of magnetization of the domains are opposite with each other. A magnetic domain wall displacement type magnetic recording element 100 shown in FIG. 1 has a first magnetic domain 22 which has the magnetization oriented in a +z direction and a second magnetic domain 23 which has the magnetization oriented in a −z direction.

Furthermore, as explained below, a magnetic recording layer of the present disclosure can include a first part including a position, where the first magnetization fixed part overlaps with the magnetic recording layer in planar view observed from the z direction. The magnetic recording layer can include a second part. The second part preferably connects with the first part via the domain wall, and can be positioned at a side nearer to the first via part than the first part. The second part can have a part which overlaps with the first via part in planar view observed from the z direction.

The magnetic domain wall displacement type magnetic recording element 100 records data continuously or multi-leveled manner according to the position of a magnetic domain wall 21 of the magnetic recording layer 20. The data recorded in the magnetic recording layer 20 is read out, for example, as a change in resistance value between a first magnetization fixed part 10 and a first via part 50. When the magnetic domain wall 21 moves, that is, transfers, a ratio between the first magnetic domain 22 and the second magnetic domain 23 in the magnetic recording layer 20 changes. The magnetization direction of the first magnetization fixed layer 11 is the same (parallel) with that of the first magnetic domain 22, and is opposite (anti-parallel) to that of the second magnetic domain 23. When the magnetic domain wall 21 transfers to the x direction and the area of the first magnetic domain 22, which overlaps with the first magnetization fixed layer 11 in planar view from the z direction, increases, resistance of the magnetic domain wall displacement type magnetic recording element 100 decreases. On the other hand, when the magnetic domain wall 21 transfers to the −x direction and the area of the second magnetic domain 23, which overlaps with the first magnetization fixed layer 11 in planar view from the z direction, increases, resistance of the magnetic domain wall displacement type magnetic recording element 100 increases.

A magnetic domain wall 21 transfers by applying the external magnetic field or supplying a current in an extending direction of the magnetic recording layer 20. For example, when the magnetic recording layer 20 has a configuration wherein effects of spin-transfer torque (STT) is mainly used, by applying current pulse to the second via part 60 from the first via part 50, electrons spin-polarized in the +z direction in the first magnetic domain wall 21 flow into the second magnetic domain 23, and the magnetic domain wall 21 transfers to the direction where the second magnetic domain 23 is located. The position of the magnetic domain wall 21 can be controlled by selecting the direction and intensity of current, which flows in the magnetic recording layer 20. Here, when the magnetic recording layer 20 has a configuration wherein the effect of spin orbit torque (SOT) is mainly used, the first magnetic domain wall 21 can be transferred to a direction which is the same as that of current.

The magnetic recording layer 20 can be composed of a magnetic material. As the magnetic material which forms the magnetic recording layer 20, the material which can be used for the first magnetization fixed layer 11 can be also used. Furthermore, it is preferable that the magnetic recording layer 20 contains at least one element selected from the group consisting of Co, Ni, Pt, Pd, Gd, Tb, Mn, Ge and Ga. For example, a laminated film of Co and Ni, a laminated film of Co and Pt, a laminate film of Co and Pd, a MnGa based material, a GdCo based material, a TbCo based material and the like can be cited. A ferrimagnetic material such as the MnGa based material, the GdCo based material, the TbCo based material and the like has small saturation magnetization, and therefore, it is possible to decrease the threshold current which is required to transfer the magnetic domain wall. In addition, the laminated film of Co and Ni, the laminated film of Co and Pt and the laminated film of Co and Pt have a high coercivity, and therefore it is possible to suppress a moving speed of the magnetic domain wall.

(Nonmagnetic Layer)

Conventionally known materials can be used for a nonmagnetic layer 30. For example, when a nonmagnetic layer 30 consists of an insulator (when a nonmagnetic layer 30 is a tunnel barrier layer), $Al_2O_3$, $SiO_2$, MgO, $MgAl_2O_4$ and the like can be used as a material of the layer. In addition, materials or the like wherein at least one of Al, Si and Mg in the aforementioned compounds is exchanged to Zn, Be or the like can also be used as well as the aforementioned materials. Among them, MgO and $MgAl_2O_4$ are materials which enable coherent tunnel, and therefore a spin injection can be efficiently performed. When the nonmagnetic layer 30 is made of metal, Cu, Au, Ag and the like can be used as the material of the layer. When the nonmagnetic layer 30 is made of a semiconductor, Si, Ge, $CuInSe_2$, $CuGaSe_2$, $Cu(In, Ga)Se_2$ and the like can be used as the material of the layer.

(Magnetization Transfer Layer)

A magnetization transfer layer 35 includes a magnetic material. As the magnetic material which forms the magnetization transfer layer 35, materials which can be used for the first magnetization fixed layer 11 can be also used.

The magnetization transfer layer 35 is adjacent to the magnetic recording layer 20. The magnetization of the magnetization transfer layer 35 forms a magnetic coupling with that of the magnetic recording layer 20. The magnetization transfer layer 35 reflects the magnetic condition of the magnetic recording layer 20. When the magnetization transfer layer 35 forms a ferromagnetic coupling with the magnetic recording layer 20, the magnetic condition of the magnetization transfer layer 35 becomes the same with that of the magnetic recording layer 20. When the magnetization transfer layer 35 forms an anti-ferromagnetic coupling with the magnetic recording layer 20, the magnetic condition of the magnetization transfer layer 35 becomes opposite to that of the magnetic recording layer 20.

The magnetization transfer layer 35 can increase a magneto resistance change rate (MR ratio) of the magnetic domain wall displacement type magnetic recording element 100. A MR ratio of the magnetic domain wall displacement type magnetic recording element 100 is caused by the change of the magnetic condition of the two magnetic materials (the first magnetization fixed layer 11 and the magnetization transfer layer 35) by which the nonmagnetic layer 30 is sandwiched.

When the magnetization transfer layer 35 is not provided, materials which can be used for the magnetic recording layer 20 are limited. The reason is that it is necessary to select materials which can increase a MR ratio and easily control a magnetic domain wall 21. On the other hand, when the magnetization transfer layer 35 is provided, functions required for each layer can be shared. For example, the magnetization transfer layer 35 can be allowed to perform mainly a function of increasing a MR ratio, and the magnetic recording layer 20 can be allowed to perform mainly a function which transfers a magnetic domain wall 21. For the magnetization transfer layer 35, a material which can provide a coherent tunnel effect with the first magnetization fixed layer 11 can be selected, and for the magnetic recording layer 20, a material which can decrease the moving speed of a magnetic domain wall can be selected.

(Second Magnetization Fixed Part)

A second magnetization fixed part 40 is a laminate which includes a second magnetization fixed layer 41, a spacer layer 42 and a second coupling layer 43. The second magnetization fixed layer 41 is located at the side of the magnetic recording layer 20. The second coupling layer 43 is located apart from the magnetic recording layer 20. The spacer layer 42 is located between the second magnetization fixed layer 41 and the second coupling layer 43. Antiferromagnetic coupling is formed between the second magnetization fixed layer 41 and the second coupling layer 43.

The second magnetization fixed part 40 can prevent the magnetic recording layer 20 as a whole from the formation of the single magnetic domain, since the second magnetization fixed part 40 can prevent the arrival of the magnetic domain wall 21 of the magnetic recording layer 20 to an end of the magnetic recording layer 20. The magnetic domain wall 21 does not transfer beyond an end face of the second magnetization fixed part 40 which is positioned at the side of the first magnetization fixed part 10, due to the influence of the magnetization of the second magnetization fixed layer 41.

Each of the second magnetization fixed layer 41, the spacer layer 42 and the second coupling layer 43 can have configurations and use materials, which are similar to that usable for the first magnetization fixed layer 11, the spacer layer 12 and the first coupling layer 13.

(First Via Part)

A first via part 50 is electrically connected to the magnetic recording layer 20. The first via part 50 can be connected to the magnetic recording layer 20 directly or indirectly via another layer. The first magnetization fixed part 10 is located between the first via part 50 and the second magnetization fixed part 40 in planar view observed from the z direction. The first via part 50 extends in the z direction from the magnetic recording layer 20.

Materials which have high conductivity can be used for the first via part 50. Specifically, it is preferable that materials which have a lower electric resistivity than that of the magnetic recording layer 20 are used for the first via part 50. For example, copper, aluminum, silver or the like can be used. Furthermore, in addition, a nitride film having conductivity or the like can be used.

Figure 2:
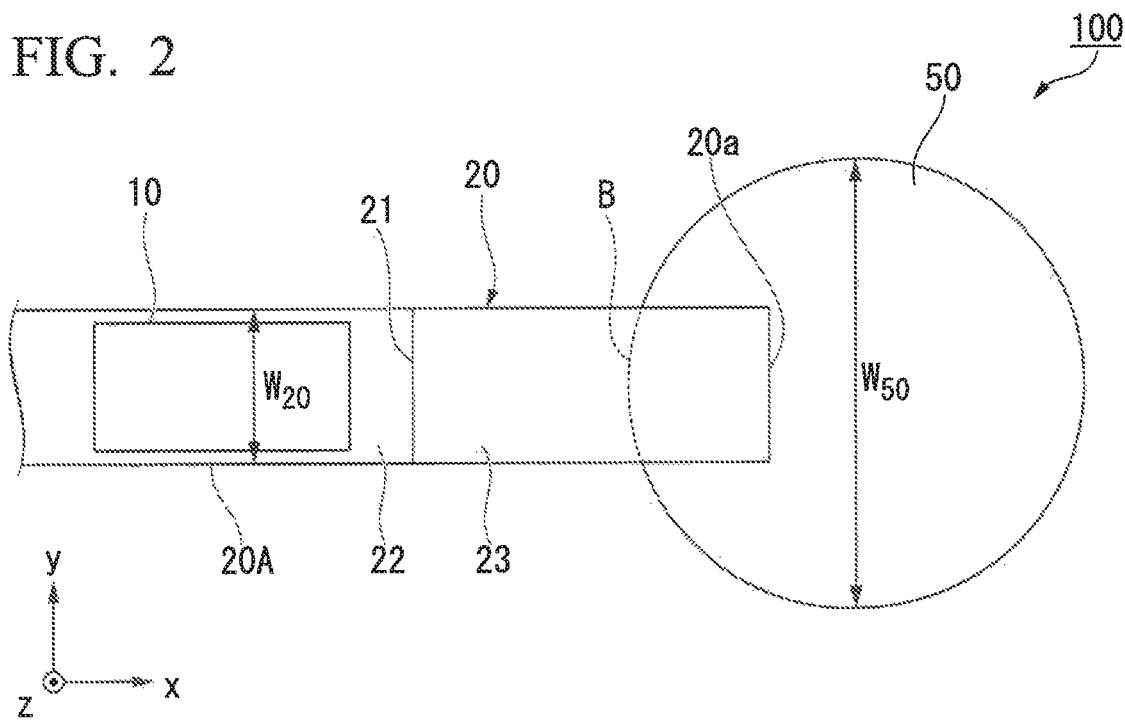
FIG. 2 is a schematic plan view which shows a preferable example of a magnetic domain wall displacement type magnetic recording element according to the first embodiment of the present disclosure.

FIG. 2 is a plan view which shows the magnetic domain wall displacement type magnetic recording element 100 according to the first embodiment. FIG. 2 is a plain view observed in the z direction. FIG. 2 is different from FIG. 1 in that a domain wall has been transferred. As shown in FIG. 2, the width $W_{50}$ of the first via part 50 is larger than the width $W_{20}$ of the magnetic recording layer 20. The magnetic recording layer 20 shown in FIG. 2 has an uniform width in the y direction. Therefore, the width $W_{20}$ of the magnetic recording layer 20 is the same with the width of a first part 20A of the magnetic recording layer. The first part 20A is a part of the magnetic recording layer 20, and the first part 20A has a part where the first magnetization fixed part 10 overlaps with the magnetic recording layer 20 in the x direction, when the element is observed from the z direction in planar view. The widths of the each part means the widths in the y direction. The width of the first part 20A does not mean the width of a part of the magnetic recording layer which overlaps with the first magnetization fixed part 10 (that is, the width of the first magnetization fixed part 10) but means the width of the magnetic recording layer 20, even when the width of the first magnetization fixed part 10 is smaller than the width of the magnetic recording layer 20 in the y direction.

When the width $W_{50}$ of the first via part 50 is larger than the width $W_{20}$ of the magnetic recording layer 20, the controllability of the magnetic domain wall 21 of the magnetic recording layer 20 can be improved. In FIG. 2, the first via part 50 has a columnar shape, and the width $W_{50}$ of the first via part 50 is a diameter of a circular surface of the part.

When the width $W_{50}$ of the first via part 50 is larger than the width $W_{20}$ of the magnetic recording layer 20, a current density drastically decreases at the part where the magnetic recording layer 20 overlaps with the first via part 50 in planar view from the z direction. The decrease in the current density limits the magnetic domain wall displacement, that is, the transfer (motion) of the magnetic domain wall 21 is limited. The movement of the magnetic domain wall 21 which transfers to the x direction is limited at the interface B between the first via part 50 and the magnetic recording layer. The single magnetic domain formation of the magnetic recording layer 20 is not caused so long as the magnetic domain wall 21 does not arrive at a first end 20a of the magnetic recording layer 20. That is, the transfer range of the magnetic domain wall 21 can be limited when the width $W_{50}$ of the first via part 50 is set to be larger than the width $W_{20}$ of the magnetic recording layer 20. The element structure of the magnetic domain wall displacement type magnetic recording element 100 can be simplified, since it is not necessary to provide a magnetization fixed part between the magnetic recording layer 20 and the first via part 50.

When the width $W_{50}$ of the first via part 50 is larger than the width $W_{20}$ of the magnetic recording layer 20, a heat distribution generated when data is recorded becomes small.

That is, the temperature difference becomes small. The first via part 50 can be made of a material which is excellent in heat conductivity than that of the magnetic recording layer 20. The temperature of each point of the magnetic recording layer 20 is greatly influenced by the length from the first via part 50 which is a heat discharge part. When the width $W_{50}$ of the first via part 50 is larger than the width $W_{20}$ of the magnetic recording layer 20, a heat distribution of the magnetic recording layer 20 in the y direction can become small. That is, it is possible to decrease a difference in temperature in a heat distribution in the y direction (difference between the highest temperature and the lowest temperature of the distribution) and/or to form a smooth and low heat distribution. When the width $W_{50}$ of the first via part 50 is smaller than the width $W_{20}$ of the magnetic recording layer 20, a difference in temperature in a heat distribution in the y direction may increase and/or a steep and high heat distribution may be generated.

The transfer speed of the magnetic domain wall 21 is influences by the temperature. The transfer speed of the magnetic domain wall 21 becomes higher at a part having a higher temperature, and becomes lower at a part having a lower temperature. When the heat distribution (heat difference) of the magnetic recording layer is small in the y direction, the magnetic domain wall 21 can transfer to the x direction while keeping the state of the wall nearly parallel with the y direction. That is, when the width $W_{50}$ of the first via part 50 is larger than the width $W_{20}$ of the magnetic recording layer 20, the generation of an inclination and/or slope of the magnetic domain wall 21 can be limited.

When the magnetic domain wall 21 is not parallel to the y direction, that is, the magnetic domain wall 21 is inclined against the y direction, a resistance value of the magnetic domain wall displacement type magnetic recording element 100 is influenced by the inclination angle to the y direction of the magnetic domain wall 21 or the like. When the number of parameters which affect the resistance value of the magnetic domain wall displacement type magnetic recording element 100 increases, it is difficult to record the data stably.

(Second Via Part)

A second via part 60 is located at a position where the first magnetization fixed part 10 is located between the first via part 50 and the second via part 60. The second via part 60 is located at a side opposite to the magnetic recording layer 20 of the second magnetization fixed part 40.

Material which has high conductivity can be used for second via part 60. For example, copper, aluminum, silver and the like can be cited. In addition, a nitride film having conductivity and the like can be used.

The width W60 in the y direction of the second via part 60 shown in FIG. 1 is larger than the width in the y direction of the magnetic recording layer 20. The second via part 60 can be made of a material which is excellent in heat conductivity than that of the magnetic recording layer 20. When the width of the second via part 60 is larger than the width of the magnetic recording layer 20, a heat distribution generated when data is recorded becomes small.

A magnetic domain wall displacement type magnetic recording element 100 according to the first embodiment can be generated by the conventionally known method. After each layer of the magnetic domain wall displacement type magnetic recording element 100 are formed, and processing can be perform to the formed layers to provide a predetermined shape. Examples of the film formation method includes a sputtering method, a chemical vapor deposition (CVD) method and the like. Examples of the processing method include technique such as photolithography or the like.

As described above, the magnetic domain wall displacement type magnetic recording element 100 according to the first embodiment can control the transfer range of the magnetic domain wall 21.

The orientation direction of the magnetization of the first magnetic domain 22 and that of the second magnetic domain 23 of the magnetic recording layer 20 are opposite to each other. In general, two magnetization fixed parts, which have different magnetization directions, are provided in the magnetic recording layer 20 in order to fix the magnetization of the first magnetic domain 22 and that of the second magnetic domain 23. However, it is difficult to generate the magnetization fixed parts having the different magnetization direction in the same plane. The magnetic domain wall displacement type magnetic recording element 100 according to the first embodiment can control the transfer range of the magnetic domain wall 21 just by adjusting the width of the first via part 50 and the width of the magnetic recording layer 20, and therefore, it is possible to decrease the number of the magnetization fixed parts.

Furthermore, the magnetic domain wall displacement type magnetic recording element 100 according to the first embodiment can control an inclination of the magnetic domain wall 21. Since the magnetic domain wall 21 can transfer in a state which is nearly parallel to the y direction, noise which affects a resistance value of the magnetic domain wall displacement type magnetic recording element 100 can be decreased and data is stably recorded.

Second Embodiment

In the second embodiment, a recording element is explained wherein a magnetic recording layer includes two or more parts which have different widths and/or thicknesses with each other.

Figure 3:
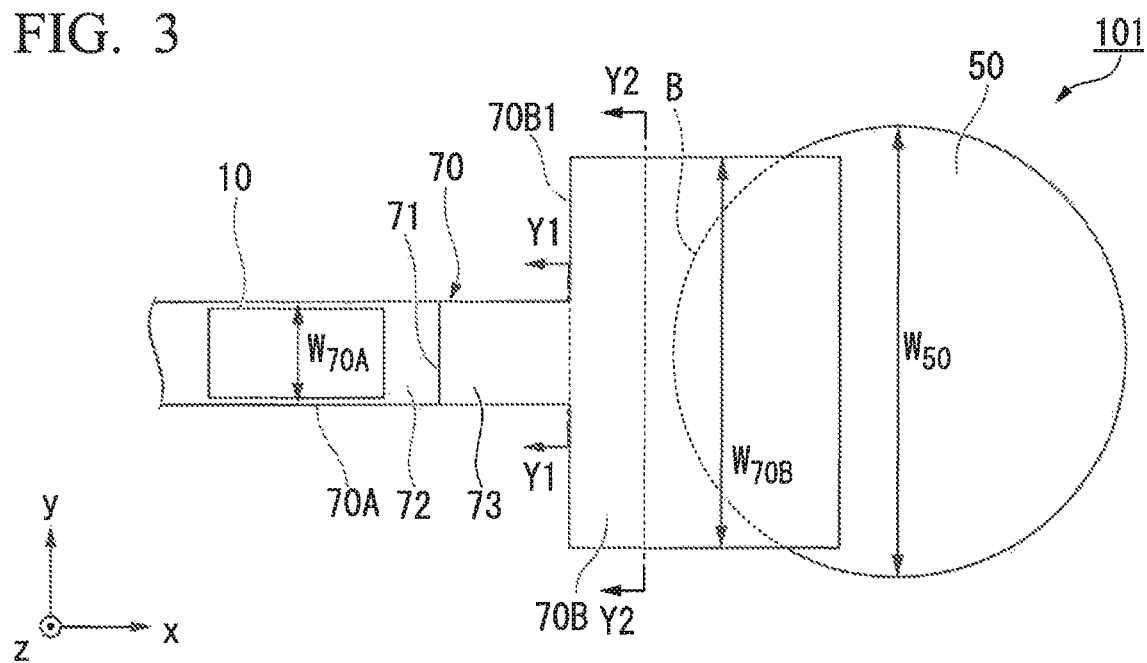
FIG. 3 is a schematic plan view which shows a preferable example of a magnetic domain wall displacement type magnetic recording element according to the second embodiment of the present disclosure.

FIG. 3 is a plan view which schematically shows an example of a magnetic domain wall displacement type magnetic recording element 101 according to the second embodiment. A magnetic recording layer 70 of the magnetic domain wall displacement type magnetic recording element 101 according to the second embodiment has a shape which is different from that of the magnetic recording layer 20 of the magnetic domain wall displacement type magnetic recording element 100. Other structure is the same with that of the first embodiment and the same reference numerals are provided. Since the same reference numerals will be used for the same components, descriptions thereof will be omitted.

The magnetic recording layer 70 includes a first part 70A and a second part 70B. The first part 70A is a part of the magnetic recording layer 70, and includes an area where the first magnetization fixed part 10 overlaps with the magnetic recording layer 70 in the x direction, when the element is observed from the z direction in planar view. The second part 70B is located at the position closer to the first via part 50 than the first part 70A. At least a part of the second part 70B is overlapped with at least a part of the first via part 50 in planar view. The second part 70B shown in FIG. 3 has a rectangular shape in planar view observed from the z direction.

The width $W_{70B}$ in the y direction of the second part 70B is larger than the width $W_{70A}$ in the y direction of the first part 70A. The magnetic recording layer 70 shown in FIG. 3 has the first part 70A and the second part 70B which has the same thickness. Accordingly, the cross-sectional area of the second part 70B obtained by cutting the part in the yz plane is larger than the cross-sectional area of the first part 70A obtained by cutting the part in the yz plane.

The width $W_{50}$ in the y direction of a first via part 50 is larger than the width $W_{70A}$ in the y direction of the first part 70A and is also larger than the width $W_{70B}$ in the y direction of the second part 70B. The magnetic recording layer 70 has a magnetic domain wall 71 between a first magnetic domain 72 and a second magnetic domain 73.

In FIG. 3, a first end 70B1 of the second part 70B, which is located at a side closer to the first magnetization fixed part 10, is positioned between the first magnetization fixed part 10 and the first via part 50, when the element is observed from the z direction in planar view. The first end 70B1 is a boundary between the first part 70A and the second part 70B. The current density of a writing current drastically decreases at the first end 70B1 and the interface B between the first via part 50 and the magnetic recording layer 70. Accordingly, the transfer of the magnetic domain wall 71 can be suppressed at the two areas. The magnetic recording layer 70 can be furthermore prevented from forming the single magnetic domain by providing plural positions which can inhibit the transfer of the magnetic domain wall 71.

Figure 4:
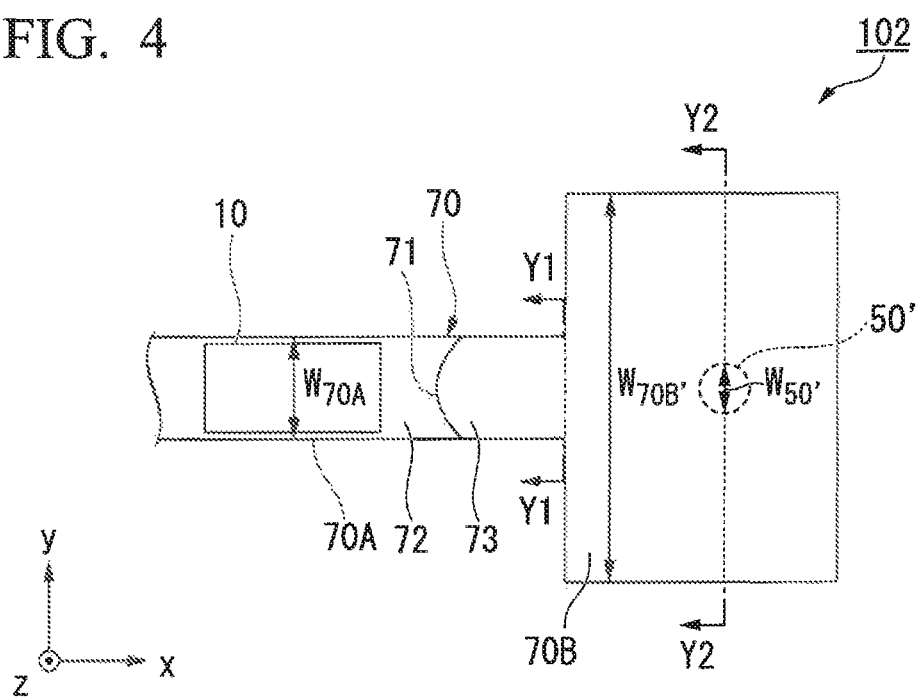
FIG. 4 is a schematic plan view which shows a magnetic domain wall displacement type magnetic recording element of Comparative Example.

FIG. 4 is a plan view which shows a magnetic domain wall displacement type magnetic recording element according to Comparative Example. The magnetic domain wall displacement type magnetic recording element 102 shown in FIG. 4 has a first via part 50' which is different from that of the magnetic domain wall displacement type magnetic recording element 101 shown in FIG. 3. The first via part 50' has a diameter which is smaller than that of the first via part 50. As shown in FIG. 4, the width $W_{50'}$ in the y direction of the first via part 50' is smaller than the width $W_{70A}$ in the y direction of the first part 70A.

Figure 5A:
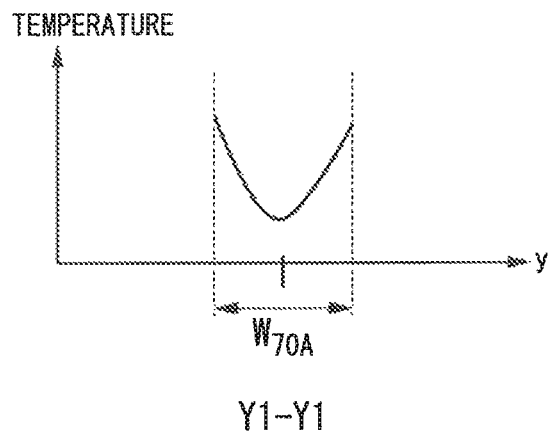
FIG. 5A shows the distribution of temperatures which are generated in the y direction at a Y1-Y1 plane shown in a dotted line of a magnetic recording layer, when a writing current is applied to the magnetic recording layer of the magnetic domain wall displacement type magnetic recording element shown in FIG. 4 of Comparative Example.
Figure 5B:
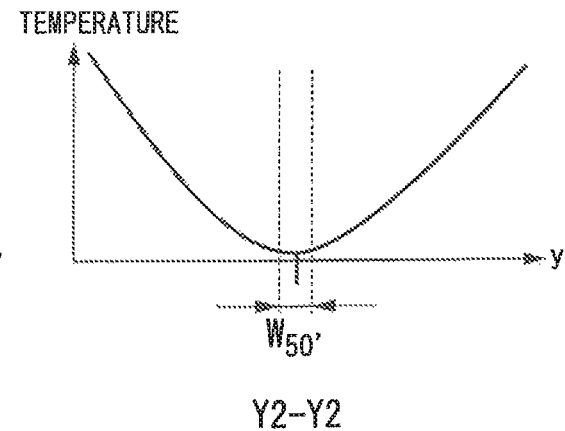
FIG. 5B shows the distribution of temperatures which are generated in the y direction at a Y2-Y2 plane shown in a dotted line of a magnetic recording layer, when a writing current is applied to the magnetic recording layer of the magnetic domain wall displacement type magnetic recording element shown in FIG. 4 of Comparative Example.

FIGS. 5A and 5B show distributions of temperature which is generated in the y direction when a writing current is applied to a magnetic recording layer 70 of the magnetic domain wall displacement type magnetic recording element 102 shown in FIG. 4. FIG. 5A shows a temperature distribution in the y direction of a Y1-Y1 plane which is a boundary between the first part 70A and the second part 70B shown in FIG. 4. FIG. 5B shows a temperature distribution in the y direction of a Y2-Y2 plane which passes through the first via part 50' shown in FIG. 4.

The first via part 50' is made of a material which is excellent in heat conductivity than that of the magnetic recording layer 70. Accordingly, heat is easily discharged from parts of the magnetic recording layer 70, which contact with the first via part 50', as compared with other parts of the magnetic recording layer 70. The temperature of each point of the magnetic recording layer 70 is greatly influenced by the distance from the first via part 50' which is a heat discharge part. Accordingly, the temperature distribution shown in FIG. 5B is generated in the Y2-Y2 plane. The similar relationship is also observed in the Y1-Y1 plane. That is, the temperature is reduced at the center part in the y direction which is closer to the first via part 50'. As a result, temperature distribution shown in FIG. 5A is generated. In FIGS. 5A and 5B, a symmetrical distribution is shown in which a temperature increases from the center toward both ends and steep slopes are generated.

The transfer speed of a magnetic domain wall 71 is influenced by temperature. The transfer speed of the magnetic domain wall 71 becomes faster at a part where the temperature is high, and becomes slower at a part where the temperature is low. The shape of the magnetic domain wall 71 is curved due to the influence of the temperature. When the magnetic domain wall 71 is curved, the magnetic domain wall 71 enters at an oblique state into the interface between the first part 70A and the second part 70B, that is, in a state not parallel to the interface. When the magnetic domain wall 71 obliquely enters into the interface, a part of a first magnetic domain 72 is easily leached out to the second part 70B. That is, the transfer of the magnetic domain wall 71 may be suppressed insufficiently, and the single magnetic domain formation of the e magnetic recording layer 70 may be caused.

Figure 6A:
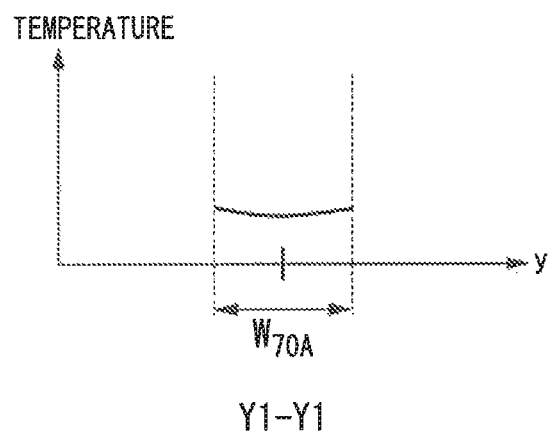
FIG. 6A shows the distribution of temperatures which are generated in the y direction at a Y1-Y1 plane shown in a dotted line of a magnetic recording layer, when a writing current is applied to the magnetic recording layer of the magnetic domain wall displacement type magnetic recording element shown in FIG. 3 according to the second embodiment of the present disclosure.
Figure 6B:
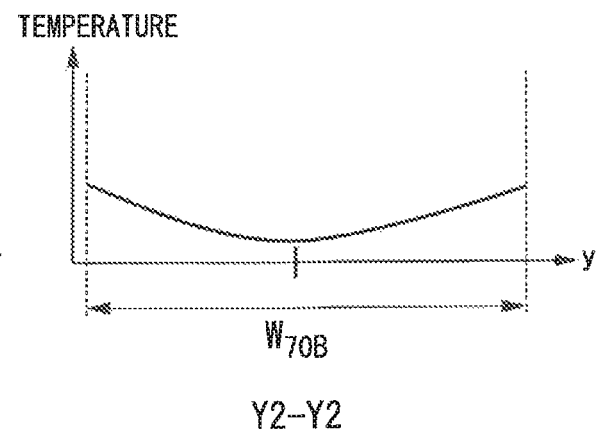
FIG. 6B shows the distribution of temperatures which are generated in the y direction at a Y2-Y2 plane shown in a dotted line of a magnetic recording layer, when a writing current is applied to the magnetic recording layer of the magnetic domain wall displacement type magnetic recording element shown in FIG. 3 according to the second embodiment of the present disclosure.

FIGS. 6A and 6B show distributions of temperature which is generated in the y direction when a writing current is applied to a magnetic recording layer 70 of the magnetic domain wall displacement type magnetic recording element 101 of the present disclosure shown in FIG. 3. FIG. 6A shows the temperature distribution in the y direction of a Y1-Y1 plane which is a boundary between the first part 70A and the second part 70B shown in FIG. 3. FIG. 6B shows the temperature distribution in the y direction of a Y2-Y2 plane which passes through a second part 70B shown in FIG. 3. In FIGS. 6A and 6B, a symmetrical distribution having gentle slope is shown.

The first via part 50 can be made of a material which is excellent in heat conductivity than that of the magnetic recording layer 70. The temperature of each point of the magnetic recording layer 70 is greatly influenced by the distance from the first via part 50 which is a heat discharge part. When the width $W_{50}$ of the first via part 50 is larger than the width $W_{70B}$ in the y direction of the second part 70B, a heat distribution of a Y2-Y2 plane in the y direction becomes small as shown in FIG. 6B. That is, it is possible to alleviate temperature difference in a width direction. When the width W50 of the first via part 50 is larger than the width 70A in the y direction of the first part 70A, a heat distribution of a Y1-Y1 plane in they direction becomes small as shown in FIG. 6A.

The magnetic domain wall 71 can transfer in a state which is nearly parallel with the y direction, when the heat distribution in the y direction of the magnetic recording layer 70 is small. That is, generation of an inclination of the magnetic domain wall 71 can be limited, and the magnetic domain wall displacement type magnetic recording element 101 can record data stably.

As described above, the magnetic domain wall displacement type magnetic recording element 101 according to the second embodiment can furthermore control the transfer range of the magnetic domain wall 71, and can furthermore prevent the single magnetic domain formation in the magnetic recording layer 70. Furthermore, since the magnetic domain wall 71 can transfer in a state which is nearly parallel with the y direction, noise which affects a resistance value of the magnetic domain wall displacement type magnetic recording element 101 can be decreased and data is stably recorded.

Figure 7:
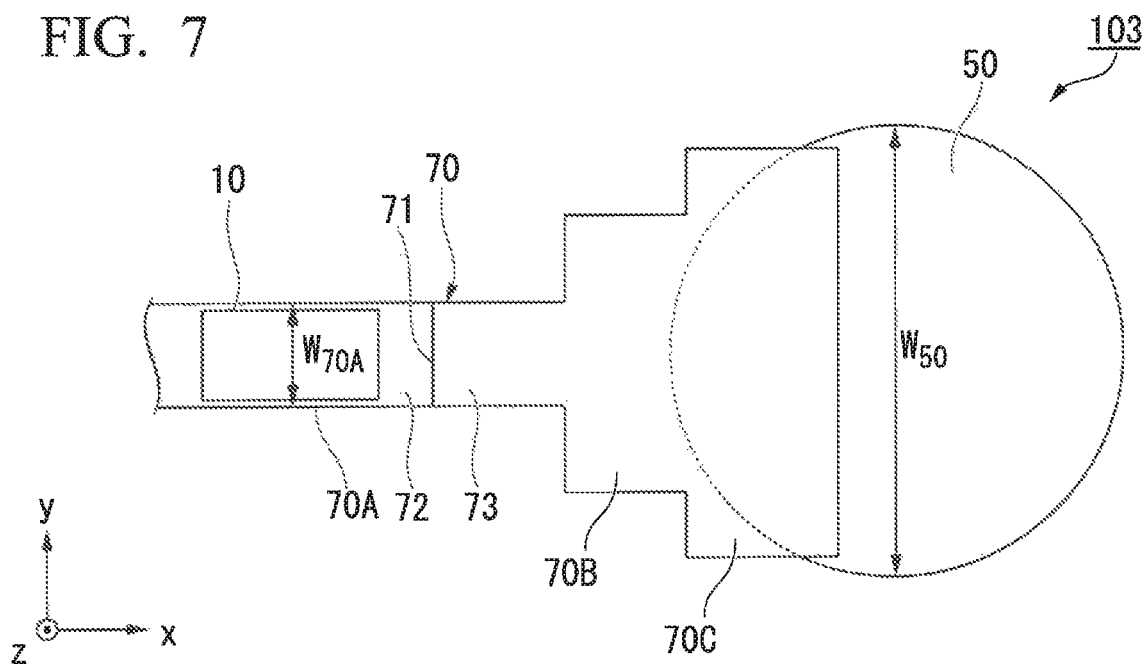
FIG. 7 is a schematic plan view which shows another preferable example of a magnetic domain wall displacement type magnetic recording element according to the second embodiment.

The magnetic domain wall displacement type magnetic recording element according to the second embodiment is not limited to examples shown in FIG. 3. In the magnetic domain wall displacement type magnetic recording element 102 shown in FIG. 3, a structure is shown wherein the magnetic recording layer 70 has two parts which have different widths with each other (the first part 70A and the second part 70B). However, a structure having three or more parts is also usable. FIG. 7 is a plan view which shows a magnetic domain wall displacement type magnetic recording element 103 wherein a magnetic recording layer 70 has three parts which have different widths with each other (a first part 70A, a second part 70B and a third part 70C).

Figure 8:
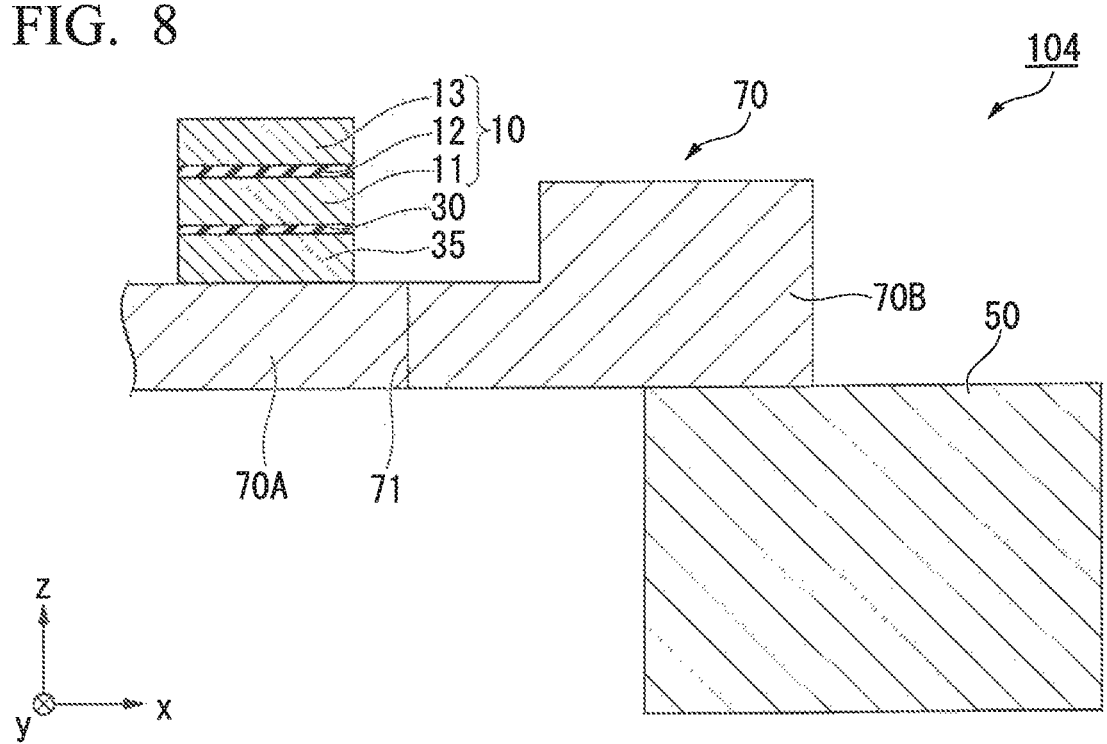
FIG. 8 is a schematic cross sectional view which shows another preferable example of a magnetic domain wall displacement type magnetic recording element according to the second embodiment.

In the magnetic domain wall displacement type magnetic recording element 102 shown in FIG. 3, the cross-sectional area of the second part 70B is made to be larger than the cross-sectional area of the first part 70A due to the differences in length in a width direction. However, the cross-sectional areas may be controlled by changing the thickness thereof. FIG. 8 is a cross sectional view in a xz plane which shows an example of a magnetic domain wall displacement type magnetic recording element 104 of the second embodiment. The magnetic domain wall displacement type magnetic recording element 104 shown in FIG. 8 includes a magnetic recording layer having two parts which have different thickness with each other. That is, the recording element includes a first part 70A and a second part 70B which has a larger thickness than that of the first part 70A. The interface between the first part 70A and the second part 70B can control the transfer of the magnetic domain wall 71.

Third Embodiment

In the third embodiment, a recording element is explained wherein a width and/or thickness of a second part increases gradually.

Figure 9:
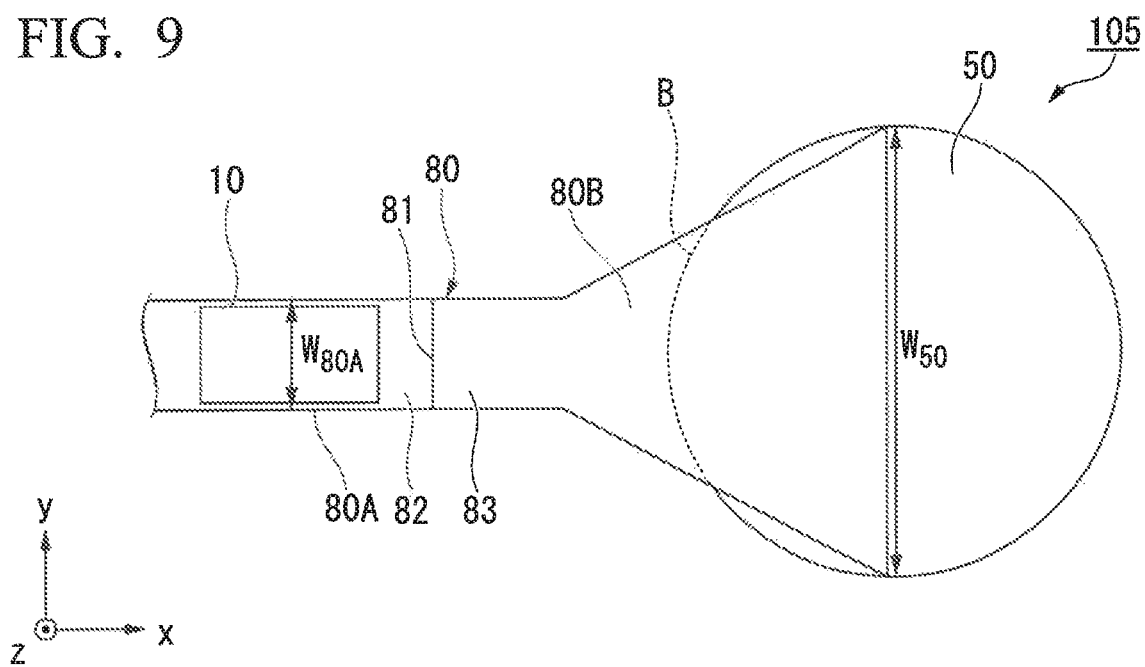
FIG. 9 is a schematic plan view which shows preferable example of a magnetic domain wall displacement type magnetic recording element according to the third embodiment of the present disclosure.

FIG. 9 is a plan view which schematically shows an example of a magnetic domain wall displacement type magnetic recording element 105 according to the third embodiment. A magnetic recording layer 80 of the magnetic domain wall displacement type magnetic recording element 105 according to the third embodiment has a shape which is different from that of the magnetic recording layer 20 of the magnetic domain wall displacement type magnetic recording element 100 according to the first embodiment. Other structure is the same with that of the first embodiment and the same reference numerals are provided. Since the same reference numerals will be used for the same components, descriptions thereof will be omitted.

A magnetic recording layer 80 includes a first part 80A and a second part 80B. The first part 80A is a part of the magnetic recording layer 80, and includes an area where the first magnetization fixed part 10 overlaps with the magnetic recording layer in the x direction, when the element is observed from the z direction in planar view. The second part 80B is located at the position closer to the first via part 50 than the first part 70A. The second part 80B shown in FIG. 9 has a trapezoidal shape in planar view observed from the z direction. The width $W_{50}$ of the first via part 50 is almost the same with a length of a long bottom side of the trapezoidal shape of the second part 80B.

The width of the second part 80B in the y direction gradually increases toward the first via part 50, that is, the width is gradually increases as the distance from the first part 80A increases. The width of the second part 80B increases gradually even at the position where the second part overlaps with the first via 50. The recitation "gradually increase" means that the width continuously and/or stepwisely increases. In the magnetic recording layer 80 shown in FIG. 9, the thickness of the first part 80A and the thickness of the second part 80B are equal. Accordingly, the cross sectional area of the second part 80B which is cut in a yz plane gradually increases in a direction toward the first via part 50.

The width $W_{50}$ of the first via part 50 in the y direction is larger than the width $W_{80A}$ of the first part 80A in the y direction. The magnetic recording layer 80 has a magnetic domain wall 81 between a first magnetic domain 82 and a second magnetic domain 83.

A current density of a writing current drastically decreases at the interface of the first part 80A and the second part 80B and the interface B of the first via part 50 and the magnetic recording layer 80, and therefore the transfer of the magnetic domain wall 81 is suppressed. The single magnetic domain formation of the magnetic recording layer 80 can be further prevented by providing plural positions which can inhibit the transfer of the magnetic domain wall 81.

In a position where a current density is dramatically changes, the disorder of a current flow is caused, and such a disorder causes generation of resistance. When the width of the second part 80B in the y direction increases gradually, generation of unnecessary resistance can be suppressed. Unnecessary resistance may become noise of the magnetic domain wall displacement type magnetic recording element 105. By reducing noise of the magnetic domain wall displacement type magnetic recording element 105, the magnetic domain wall displacement type magnetic recording element 105 can record data stably.

Furthermore, in the magnetic domain wall displacement type magnetic recording element 105 shown in FIG. 9, the cross sectional area of the second part 70B is gradually increased by increasing the length in the width direction gradually. It is also possible to increase the cross sectional area gradually by changing the thickness of the second part 70B.

Fourth Embodiment

In the fourth embodiment, a recording element is explained which has a first via part having different shape.

FIG. 10 is a plan view which schematically shows an example of a magnetic domain wall displacement type magnetic recording element 106 according to the fourth embodiment. A first via part 51 of the magnetic domain wall displacement type magnetic recording element 106 according to the fourth embodiment has a shape which is different from that of the first via part 50 of the magnetic domain wall displacement type magnetic recording element 101 according to the second embodiment in planar view observed from the z direction. Other structure is the same with that of the first embodiment and the same reference numerals are provided. Since the same reference numerals will be used for the same components, descriptions thereof will be omitted.

The first via part 51 has a shape wherein a bow shape surrounded by a circular arc and a chord of the circular arc is removed from a circle shape in planar view observed from the z direction. The first via part 51 has a first end 51B1 which is a straight line in planar view observed from the z direction. The first end 51B1 is an end face which is positioned at a side closer to the first magnetization fixed part 10 of the first via part 51. The first end 51B1 mainly extends in the y direction. The "mainly extend in the y direction" means that the main direction of the vector components of the first end 51B1 is a y direction.

When the first end 51B1 of the first via part 51 is oriented to the y direction, generation of unpreferable heat distribution of a magnetic recording layer 70 in the y direction is further suppressed. The reason is that the shortest distance to the first via part 51 from respective parts of the magnetic recording layer 70, which are provided at the same position in the x direction, is equal to the length of a perpendicular line which extends to the first end 51B1 from the respective parts of the magnetic recording layer 70, and therefore the length from the respective parts becomes identical.

Furthermore, a magnetic domain wall 71 and the first end 51B1 are almost in parallel with each other. Accordingly, the first end 51B1 suppresses strongly the transfer of the magnetic domain wall 71. That is, even when the magnetic domain wall 71 passes through the boundary between a first part 70A and second part 70B and arrives at the first end 51B1, it is possible to furthermore prevent the formation of the single magnetic domain since it is possible to prevent the magnetic domain wall 71 from passing through the first end 51B1.

Fifth Embodiment

In the fifth embodiment, a recording element is explained wherein a first magnetization fixed part partially overlaps with a first via part and a second via part.

Figure 11:
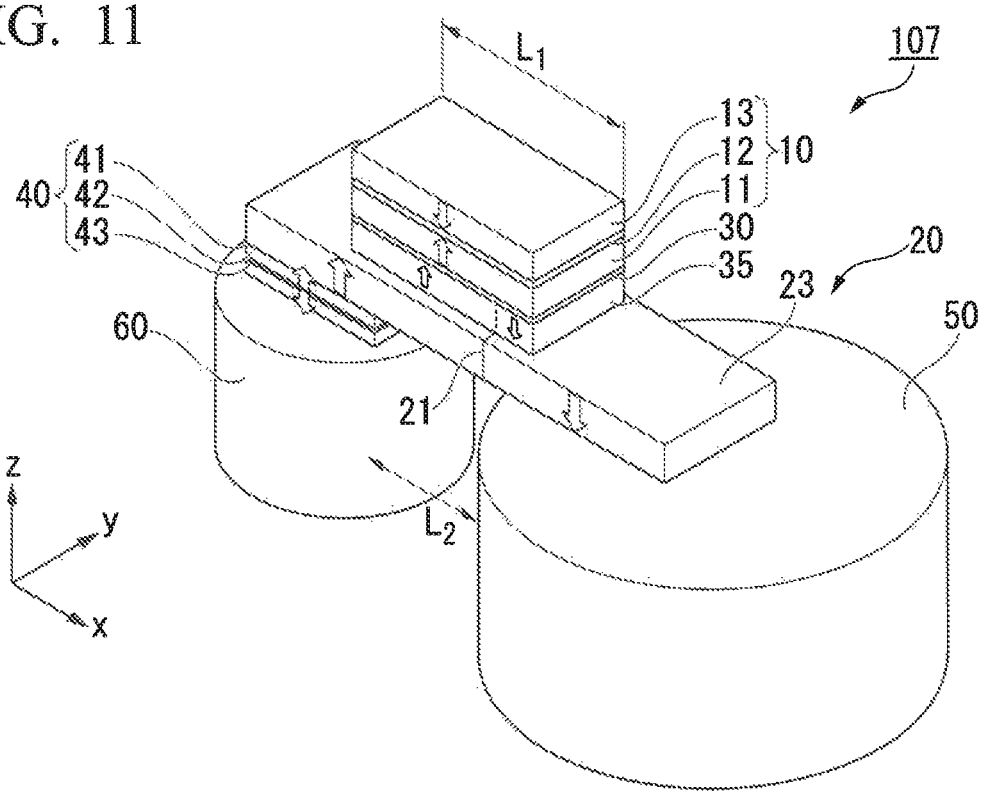
FIG. 11 is a schematic perspective view which shows preferable example of a magnetic domain wall displacement type magnetic recording element according to the fifth embodiment of the present disclosure.

FIG. 11 is a perspective view which schematically shows an example of a magnetic domain wall displacement type magnetic recording element 107 according to the fifth embodiment. The distance between a first via part 50 and a second via part 60 of the magnetic domain wall displacement type magnetic recording element 107 according to the fifth embodiment is different from that of the magnetic domain wall displacement type magnetic recording element 100 according to the first embodiment. Other structure is basically the same with that of the first embodiment and the same reference numerals are provided. Since the same reference numerals will be used for the same components, descriptions thereof will be omitted.

In the magnetic domain wall displacement type magnetic recording element 107 according to the fifth embodiment, a distance L2 between the first via part 50 and the second via part 60 in the x direction is smaller than a length of a first magnetization fixed part 10, that is, said distance is smaller than a width L1 of the first magnetization fixed part 10 in the x direction. The first via part 50 and the second via part 60 overlaps partially with the first magnetization fixed part 10 when the element is observed in the z direction.

A magnetic recording layer 20 is inferior in heat conductivity as compared to the first magnetization fixed part 10, the first via part 50 and the second via part 60. The magnetic recording layer 20 causes heat when a writing current is applied. Heat generated in the layer transfers to the first magnetization fixed part 10, the first via part 50 and the second via part 60, and is discharged from the parts. Areas of the layer which do not contact with the first magnetization fixed part 10, the first via part 50 and the second via part 60 are inferior to the heat discharge ability, and is liable to generate heat. For example, a temperature may be elevated by about 160° C. at an area of the layer which is 500 nm apart from the heat discharge part.

When the distance L2 between the first via part 50 and the second via part 60 in the x direction is designed to be smaller than the width L1 of the first magnetization fixed part 10 in the x direction, areas within the magnetic recording layer 20 can contact with, in the y direction, any one of the first magnetization fixed part 10, the first via part 50 and the second via part 60. Accordingly, heat generation at the magnetic recording layer 20 can be suppressed. Furthermore, since heat can be discharged efficiently, the heat distribution in the y direction furthermore becomes small.

Furthermore, when the first magnetization fixed part 10, the first via part 50 and the second via part 60 do not overlap with each other when the element is observed from the z direction, an area which is the sum of each area of the first magnetization fixed part 10, the first via part 50 and the second via part 60 is required for forming one element. On the other hand, when the first magnetization fixed part 10, the first via part 50 and the second via part 60 overlaps at least partially when observed from the z direction, an area required for forming one element can decrease due to the overlapped area. That is, a number of elements can be more efficiently integrated in an integrated circuit.

The widths of the first via part 50 and the second via part 60 in the x direction and the y direction are designed and cannot be freely changed. For example, it is considered that a minimum processing size (feature size: F) of a currently available semiconductor is 7 nm, and therefore, the widths of the first via part 50 and the second via part 60 in the x direction and the y direction are 7 nm at a minimum. In other words, it is difficult for the widths of the first via part 50 and the second via part 60 in the x direction and the y direction to be smaller than said size, and therefore, it is difficult to increase integration ability by changing the widths of the first via part 50 and the second via part 60.

Sixth Embodiment

In the sixth embodiment, a recording element is explained wherein a second magnetization fixed part is not provided.

Figure 12:
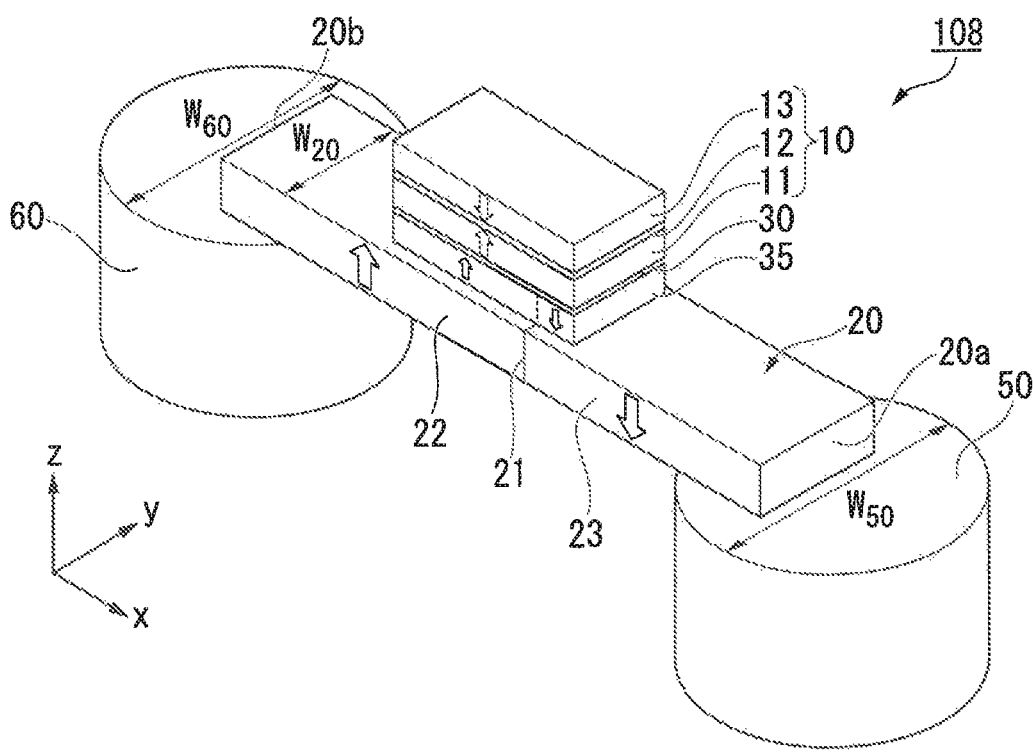
FIG. 12 is a schematic perspective view which shows preferable example of a magnetic domain wall displacement type magnetic recording element according to the sixth embodiment of the present disclosure.

FIG. 12 is a perspective view which schematically shows an example of a magnetic domain wall displacement type magnetic recording element 108 according to the sixth embodiment. The magnetic domain wall displacement type magnetic recording element 108 according to the sixth embodiment is different from the magnetic domain wall displacement type magnetic recording element 100 according to the first embodiment in that a second magnetization fixed part 40 is not included in the element. Other structure is basically the same with that of the first embodiment and the same reference numerals are provided. Since the same reference numerals will be used for the same components, descriptions thereof will be omitted.

The width $W_{50}$ in the y direction of a first via part 50 and the width $W_{60}$ in the y direction of a second via part 60 are larger than the width $W_{20}$ of a magnetic recording layer 20 in the y direction.

A current density of a writing current which flows in the magnetic recording layer 20 drastically decreases at the parts, where the magnetic recording layer 20 overlaps with the first via part 50 and the magnetic recording layer 20 overlaps with the second via part 60 in planar view observed from the z direction. The decrease in the current density limits the transfer of the magnetic domain wall 21. Accordingly, the magnetic domain wall 21 does not arrive at the first end 20a and the second end 20b of the magnetic recording layer 20, and the single magnetic domain formation of the magnetic recording layer 20 is not caused. That is, the transfer range of the magnetic domain wall 21 can be limited when the width $W_{50}$ of the first via part 50 and $W_{60}$ of the second via part 60 are set to be larger than the width $W_{20}$ of the magnetic recording layer 20. The element structure of the magnetic domain wall displacement type magnetic recording element 108 can be simplified, sine it is not necessary to provide magnetization fixed parts between the magnetic recording layer 20 and the first via part 50 and between the magnetic recording layer 20 and the second via part 60.

When the width $W_{50}$ of the first via part 50 and the width $W_{60}$ of the second via part 60 are larger than the width $W_{20}$ of the magnetic recording layer 20, a heat distribution (temperature difference) of the magnetic recording layer 20 in the y direction becomes small. The magnetic domain wall 21 can transfer in a state which is nearly parallel with the y direction, when the heat distribution in the y direction of the magnetic recording layer 20 is small. That is, an inclination of the magnetic domain wall 21 is limited, and the magnetic domain wall displacement type magnetic recording element 108 can record data stably.

Seventh Embodiment

In the seventh embodiment, a recording element is explained wherein the size of a second magnetization fixed part is different.

Figure 13:
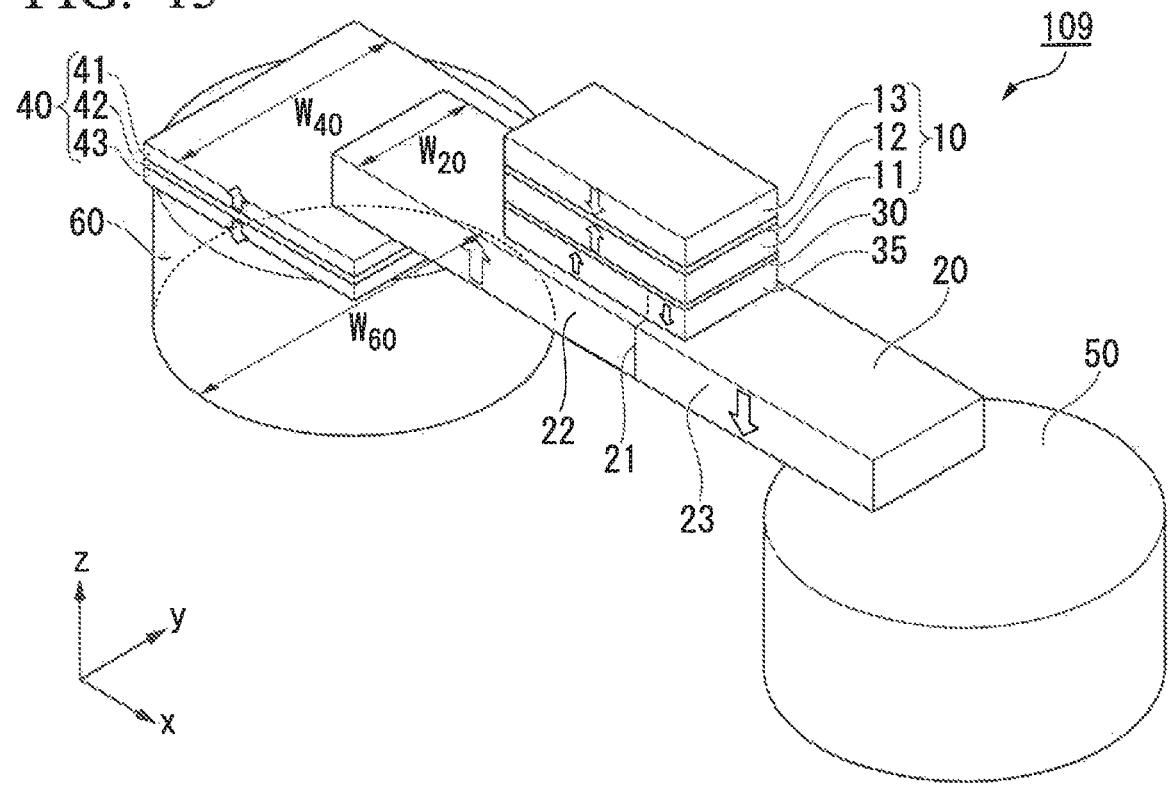
FIG. 13 is a schematic perspective view which shows preferable example of a magnetic domain wall displacement type magnetic recording element according to the seventh embodiment.

FIG. 13 is a perspective view which schematically shows an example of a magnetic domain wall displacement type magnetic recording element 109 according to the seventh embodiment. The magnetic domain wall displacement type magnetic recording element 109 according to the seventh embodiment is different from the magnetic domain wall displacement type magnetic recording element 100 according to the first embodiment in that the size of a second magnetization fixed part 40 in the xy direction is different from that of the first embodiment. Other structure is basically the same with that of the first embodiment and the same reference numerals are provided. Since the same reference numerals will be used for the same components, descriptions thereof will be omitted.

The width $W_{40}$ in the y direction of the second magnetization fixed part 40 is larger than the width $W_{20}$ in the y direction of the magnetic recording layer 20. The width $W_{40}$ in the y direction of the second magnetization fixed part 40 is equal to or smaller than the width $W_{60}$ of a second via part 60. The shape of the second magnetization fixed part 40 shown in FIG. 13 is a square in planar view.

When the width $W_{40}$ in the y direction of the second magnetization fixed part 40 is larger than the width $W_{20}$ in the y direction of the magnetic recording layer 20, a heat distribution of the magnetic recording layer 20 in the y direction becomes small, that is, temperature difference in the y direction of the layer becomes small. Furthermore, when the width $W_{60}$ of a second via part 60 is equal to or larger than the width $W_{40}$ of the second magnetization fixed part 40, it is possible to avoid the generation of the heat distribution in the y direction at the interface between the second magnetization fixed part 40 and the second via part 60. Accordingly, the heat distribution in the y direction of the layer can furthermore become small.

While the magnetic domain wall displacement type magnetic recording elements according to the aforementioned embodiments have been described and illustrated above while referring to the drawings, it should be understood that additions, omissions, substitutions, and other modifications can be made without departing from the spirit or scope of the present disclosure.

For example, it is possible to exclude a magnetization transfer layer 35 from any of the embodiments. When the magnetization transfer layer 35 is not included, a MR ratio of the magnetic domain wall displacement type magnetic recording element is caused by change in the magnetic condition of the magnetic recording layer 20 and the first magnetization fixed layer 11 by which the nonmagnetic layer 30 is sandwiched.

Furthermore, for example, the first magnetization fixed part 10 may consist of the first magnetization fixed layer 11. Furthermore, the second magnetization fixed part 40 may consist of the second magnetization fixed layer 41.

Furthermore, in the above embodiments, the cross-sectional areas of the first via part 50 and the second via part 60 which is obtained by cutting in the xy plane are fixed, but may not be fixed. For example, the first via part 50 and the second via part 60 may have a structure wherein the diameter thereof increases or decreases continuously from a first end thereof which is located at the magnetic recording layer 20 side to a second end located at the opposite side. It is preferable that the diameter of the first via part 50 and the second via part 60 changes continuously. When the diameter of the first via part 50 and the second via part 60 dramatically changes, a heat distribution is generated at the interface thereof. When the diameter of the first via part 50 and the second via part 60 changes continuously, the generation of a heat distribution can be suppressed.

Eighth Embodiment (Magnetic Recording Array)

Figure 14:
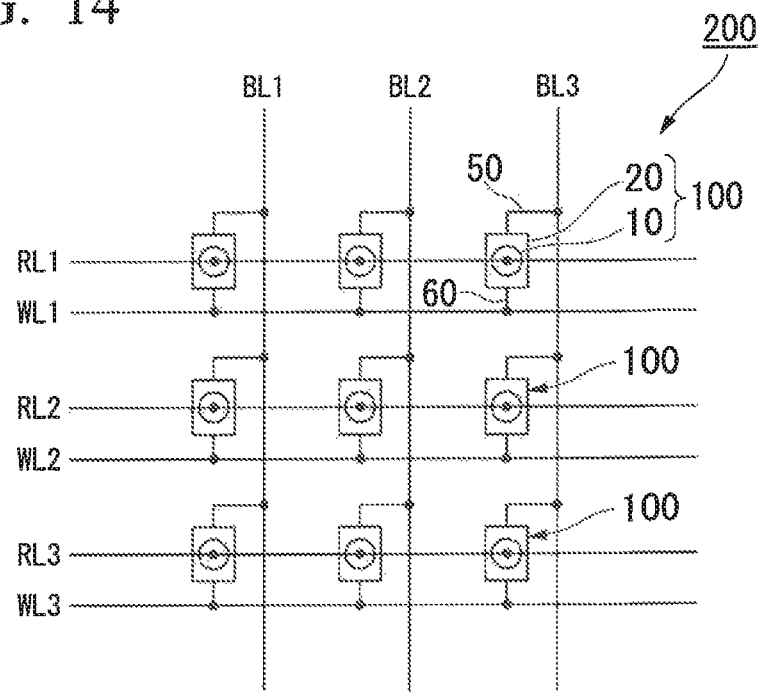
FIG. 14 is a schematic plan view which shows preferable example of a magnetic recording array according to the eighth embodiment.

In the eighth embodiment, preferable example of a magnetic recording array of the present disclosure is explained. FIG. 14 is a plan view which schematically shows an example of a magnetic recording array 200 according to the eighth embodiment. In the magnetic recording array 200 shown in FIG. 14, the magnetic domain wall displacement type magnetic recording elements 100 shown in FIG. 1 are arranged in a 3×3 matrix form. FIG. 14 shows an example of a magnetic recording array, and the kind, the number and the location of the magnetic domain wall displacement type magnetic recording element 100 can be optionally selected. The magnetic domain wall displacement type magnetic recording elements 101 and 103 to 109 shown in FIGS. 3 and 7 to 13 can also be used in the array instead of the magnetic domain wall displacement type magnetic recording element 100 shown in FIG. 1.

To respective magnetic domain wall displacement type magnetic recording element 100, one of word lines WL 1 to 3, one of bit lines BL 1 to 3 and one of read lines RL 1 to 3 are connected.

The writing operation can be performed by selecting lines from the word lines WL 1 to 3 and the bit lines BL 1 to 3, to which current is applied, and flowing a pulse current in the magnetic recording layer 20 of the optionally selected magnetic domain wall displacement type magnetic recording element 100. In addition, the reading operation can be performed by selecting lines from the read lines RL 1 to 3 and the bit lines BL 1 to 3, to which current is applied, and flowing a current in the laminated direction in the optionally selected magnetic domain wall displacement type magnetic recording element 100. The word lines WL 1 to 3, the bit lines BL 1 to 3 and the read lines RL 1 to 3 to which current is applied can be selected by due to a transistor or the like. It is possible to increase the capacity of the magnetic recording array by recording data in the plural magnetic domain wall displacement type magnetic recording elements 100, wherein the information can be recorded in the each element by multi-levels.

Furthermore, the magnetic domain wall displacement type magnetic recording elements 100 can record data not by digital signals of "1" and "0" but in an analog manner. Accordingly, the magnetic recording array can be applied to a neuromorphic device or the like which simulates brain.

As explained above, the present disclosure can provide a magnetic domain wall displacement type magnetic recording element and a magnetic recording array which are excellent in controllability of a magnetic domain wall.

While preferred embodiments of the invention have been described above, it should be understood that these are exemplary of the invention and are not to be considered as limiting to these embodiments. Modifications, substitutions, and the like can be made without departing from the scope of the present disclosure which are claimed in the present disclosure.

DESCRIPTION OF THE REFERENCE SYMBOLS

10: First magnetization fixed part
11: First magnetization fixed layer
12, 42: Spacer layer
13: First coupling layer
20, 70, 80: Magnetic recording layer
21, 71, 81: Magnetic domain wall
22, 72, 82: First magnetic domain
23, 73, 83: Second magnetic domain
20A, 70A, 80A: First part of magnetic recording layer
20B, 70B, 80B: Second part of magnetic recording layer
20$a$: First end of magnetic recording layer
20$b$: Second end of magnetic recording layer
30: Nonmagnetic layer
35: Magnetization transfer layer
40: Second magnetization fixed part
41: Second magnetization fixed layer
43: Second coupling layer
50, 50', 51: First via part
51B1: First end of first via part
60: Second via part
70B1: First end of second part of magnetic recording layer
70C: Third part of magnetic recording layer
100, 101, 102, 103, 104, 105, 106, 107, 108, 109: Magnetic domain wall displacement type magnetic recording element
200: Magnetic recording array
B: Interface between a first via part and a magnetic recording layer
L1: Width of a first magnetization fixed part in the x direction
L2: Distance between a first via part and a second via part in the x direction
$W_{20}$: Width of a magnetic recording layer in the y direction
$W_{40}$: Width of a second magnetization fixed part in the y direction
$W_{50}$, $W_{50'}$, $W_{51}$: Width of a first via part in they direction
$W_{60}$: Width of a second via part in the y direction
$W_{70A}$, $W_{80A}$: Width of a first part in the y direction
$W_{70B}$, $W_{70B'}$: Width of a second part in the y direction

The invention claimed is:

1. A magnetic domain wall displacement type magnetic recording element, comprising:
a first magnetization fixed part which is stacked in a first direction;
a magnetic recording layer which includes a magnetic domain wall and extends in a second direction which crosses with the first direction;
a non-magnetic layer which is provided between the first magnetization fixed part and the magnetic recording layer;
a first via part which is electrically connected to the magnetic recording layer; and
a second via part which is electrically connected to the magnetic recording layer; and
a second magnetization fixed part which is located between the second via part and the magnetic recording layer,
wherein
at least a part of the first via part is located at a position which is apart from the first magnetization fixed part in the second direction in planar view observed from the first direction,
the magnetic recording layer includes a first part which has a position where the first magnetization fixed part overlaps with the magnetic recording layer in planar view observed from the first direction, and
a width of the first via part in a third direction which is orthogonal to the second direction is larger than a width of said position of the first part of the magnetic recording layer,
when the first magnetization fixed part is observed from the first direction in planar view, at least a part of the first magnetization fixed part is located at a position between the first via part and the second via part,
a width of the second via part is larger than that of the magnetic recording layer in the third direction,
a width of the first part in the third direction is constant,
the width of the first via part in the third direction is larger than the width of the second via part in the third direction, and
the width of the magnetic recording layer is constant in planar view observed from the first direction.

2. The magnetic domain wall displacement type magnetic recording element according to claim 1, wherein the magnetic recording layer comprises the first part and a second part which connects with the first part, and
the second part is located on the side closer to the first via part than the first part, and contacts or does not contact with the first via part, and
the cross section of the second part is larger than the cross section of the first part, wherein the cross-sectional areas are those obtained by cutting the magnetic recording layer at faces which are perpendicular to the second direction.

3. The magnetic domain wall displacement type magnetic recording element according to claim 2, wherein a first end of the second part, which is located at a side closer to the first magnetization fixed part, is positioned between the first magnetization fixed part and the first via part in planar view observed from the first direction.

4. The magnetic domain wall displacement type magnetic recording element according to claim 2, wherein a thickness of the second part is larger than a thickness of the first part.

5. The magnetic domain wall displacement type magnetic recording element according to claim 1, wherein the cross-sectional area of the first via part which is obtained by cutting the first via part at faces which are perpendicular to the first direction is gradually changed.

6. The magnetic domain wall displacement type magnetic recording element according to claim 1, wherein when the element is observed from the first direction in planar view, the first via part includes a first end, which is a straight line, positioned at a side closer to the first magnetization fixed part, and mainly extends in the third direction.

7. The magnetic domain wall displacement type magnetic recording element according to claim 1, wherein a length between the first via part and the second via part in the second direction is smaller than the width in the second direction of the first magnetization fixed part.

8. The magnetic domain wall displacement type magnetic recording element according to claim 1, wherein the first magnetization fixed part includes a magnetization fixed layer, a spacer layer and a coupling layer in this order from the side near to the magnetic recording layer, and antiferromagnetic coupling is formed between the magnetization fixed layer and the coupling layer.

9. A magnetic recording array which includes a plurality of the magnetic domain wall displacement type magnetic recording elements according to claim 1.

10. The magnetic domain wall displacement type magnetic recording element according to claim 1, wherein the whole of the first via part is located at the position separated from the first magnetization fixed part in the second direction in planar view observed from the first direction.

11. The magnetic domain wall displacement type magnetic recording element according to claim 1, wherein a part of the first via part overlaps the first magnetization fixed part in planar view observed from the first direction.

12. The magnetic domain wall displacement type magnetic recording element according to claim 1, wherein the first direction and the second direction is orthogonal to each other.

13. The magnetic domain wall displacement type magnetic recording element according to claim 1, wherein the first via part is a circular column, and the width of the first via part is the diameter of a circular surface of the column.

14. The magnetic domain wall displacement type magnetic recording element according to claim 2, wherein the second part directly contacts the first via part.

15. The magnetic domain wall displacement type magnetic recording element according to claim 1, wherein the magnetic recording layer directly contacts the first via part.

\* \* \* \* \*